United States Patent
Yu et al.

(10) Patent No.: US 10,944,388 B1
(45) Date of Patent: Mar. 9, 2021

(54) ASYNCHRONOUS CLOCK GATING CELLS AND RELATED METHODS TO PROVIDE A GATED CLOCK OUTPUT

(71) Applicant: Silicon Laboratories Inc., Austin, TX (US)

(72) Inventors: Chester Yu, Austin, TX (US); Y Hao Lim, Singapore (SG)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/710,365

(22) Filed: Dec. 11, 2019

(51) Int. Cl.
- *H03K 5/135* (2006.01)
- *H03K 19/00* (2006.01)
- *H03K 3/012* (2006.01)
- *H03K 3/037* (2006.01)

(52) U.S. Cl.
CPC ............. *H03K 5/135* (2013.01); *H03K 3/012* (2013.01); *H03K 3/037* (2013.01); *H03K 19/0016* (2013.01)

(58) Field of Classification Search
CPC ........ H03K 5/135; H03K 3/037; H03K 3/012; H03K 19/0016
See application file for complete search history.

(56) References Cited

U.S. PATENT DOCUMENTS

2017/0110418 A1* 4/2017 Kuenemund ......... H01L 23/576
2018/0351537 A1  12/2018 Prakash et al.

OTHER PUBLICATIONS

Zhang et al., "Testable Mutex Design", IEEE Transactions on Circuits and Systems, vol. 63, No. 8, 12 pgs. (Aug. 2016).
Noor, "Design of a Novel Glitch-Free Integrated Clock Gating Cell for High Reliability", Stone Brook University, 44 pgs. (May 2016).
Kathuria et al., "A Review of Clock Gating Techniques", MIT International Journal of Electronics and Communication Engineering, vol. 1, No. 2, 9 pgs (Aug. 2011).
Davis et al., "An Introduction to Asynchronous Circuit Design", UUCS-97-013, 58 pgs. (Sep. 1997).
Clocking Schemes, Internally Generated Clocks, 11 pgs (Jan. 2012).

* cited by examiner

*Primary Examiner* — Sibin Chen
(74) *Attorney, Agent, or Firm* — Egan, Enders & Huston LLP.

(57) ABSTRACT

Improved clock gating cells and related methods are provided. The clock gating cells include a first mutually exclusive element (ME1), a first inverter and a second mutually exclusive element (ME2). ME1 receives a clock input and an enable signal, which is asynchronous to the clock input, and outputs the enable signal based on a timing relationship between the clock input and the enable signal. The first inverter receives the enable signal output from ME1 and provides an inverted enable signal to ME2. ME2 receives the clock input and the inverted enable signal, and provides a clock output based on a timing relationship between the clock input and the inverted enable signal. Together, ME1 and ME2 resolve meta-stability and eliminate glitches in the clock output by preventing rising and falling edges of the enable signal from passing through the mutually exclusive elements during active phases of the clock input.

20 Claims, 10 Drawing Sheets

Latency and "Swallowed" Clocks

Latency and "Swallowed" Clocks

ASYNCHRONOUS CLOCK GATING CELLS AND RELATED METHODS TO PROVIDE A GATED CLOCK OUTPUT

BACKGROUND

1. Field of the Disclosure

This disclosure relates to clock gating and, more particularly, to asynchronous clock gating cells that avoid meta-stability and eliminate glitches in the clock output.

2. Description of the Relevant Art

The following descriptions and examples are provided as background only and are intended to reveal information that is believed to be of possible relevance to the present invention. No admission is necessarily intended, or should be construed, that any of the following information constitutes prior art impacting the patentable character of the subjected matter claimed herein.

Clock distribution networks (or clock trees) are commonly used to distribute clock signals to various blocks or clock domains within an integrated circuit (IC), and are typically responsible for a large portion of the overall power consumption (e.g., up to about 50%) of the IC. To control power dissipation of the clock tree, clock gating is often used to turn off the clock signals supplied by the clock tree to clock domains not currently in use.

A clock gating cell generates a gated clock signal that can be used to turn a clock signal supplied to one or more registers of the clock tree on and off. Turning the clock signal off prevents the one or more registers from switching and disables the corresponding clock domain. Thus, clock gating reduces power dissipation in the clock tree by reducing unnecessary switching in one or more registers of the clock tree, and reduces overall power consumption by turning unused clock domains off.

Clock gating cells typically include logic circuitry, which is driven by an enable signal. Although a synchronous enable signal can be used to turn off a clock domain in a purely synchronous manner, the portion of the clock tree supplying the clock domain keeps toggling and the internal circuitry of each register remains active (although outputs do not change values). As such, synchronous clock gating cannot be used to reduce power consumption in the clock tree. On the other hand, a clock gating cell driven by an asynchronous enable signal can be used to reduce power consumption in the clock tree by preventing registers coupled to the clock gating cell from switching until the asynchronous enable signal is received. Unfortunately, asynchronous clock gating often results in clock glitches and meta-stability issues.

FIG. 1A (PRIOR ART) illustrates a conventional clock gating cell 10 implemented with a two-input AND gate 12. The AND gate clock gating cell 10 shown in FIG. 1A generates a gated clock (clk_out) only when the clock input (clk_in) and enable signal are both active high (see, FIG. 1B). Since the enable signal is asynchronous, clock glitches may occur in the gated clock (clk_out) on rising and falling edges of the enable signal, as shown in FIG. 1B (PRIOR ART). These clock glitches may violate minimum pulse width requirements and create timing issues for downstream circuitry. For example, a clock glitch may violate downstream register timing if the data input of the register is changing when a clock glitch reaches the clock input of the register. If a glitchy clock is supplied to multiple registers, some registers may receive the clock input, while others may miss it. This is because the clock glitch can shrink into nothing due to different clock tree paths with different RC delays.

To avoid clock glitches, the conventional clock gating cell 20 shown in FIG. 2A (PRIOR ART) adds a level sensitive latch 14 to the two-input AND gate 12. In the latch-based AND gate clock gating cell 20 shown in FIG. 2A, the latch 14 holds the active high enable signal until the next falling edge of the clock input (clk_in) is received by the latch. Once the enable signal is latched (enable_lat), the AND gate 12 generates a gated clock (clk_out) on the next rising edge of the clock input (clk_in). Although clock gating cell 20 avoids clock glitches, the latch 14 may produce a metastable output or event (enable_lat) when a rising or falling edge of the enable signal is received on or near a latching edge (e.g., a rising edge) of the clock input, as shown in FIG. 2B (PRIOR ART). Metastability occurs in digital logic circuits when a signal falls within an intermediate range between a high voltage value representing a logic '1' and a low voltage value representing a logic '0'. In metastable states, the digital logic circuit may be unable to settle into a stable '0' or '1' logic level within the time required for proper circuit operation. As a result, the digital logic circuit can act in unpredictable ways, and may lead to a system failure.

FIG. 3A (PRIOR ART) illustrates a conventional clock gating cell 30, which avoids clock glitches and metastability by adding a synchronizer circuit 16 to the AND gate clock gating cell shown in FIG. 1A. In the conventional clock gating cell 30 shown in FIG. 3A, synchronizer circuit 16 synchronizes the enable signal to the clock input (clk_in) before supplying a synchronized enable signal (enable_sync) to the AND gate 12. Once the synchronized enable signal (enable_sync) is received, AND gate 12 generates a gated clock (clk_out) on the next rising edge of the clock input (clk_in), as shown in FIG. 3B (PRIOR ART).

FIG. 4A (PRIOR ART) illustrates another conventional clock gating cell 40, which avoids clock glitches and metastability by adding a synchronizer circuit 16 to the latch-based AND gate clock gating cell shown in FIG. 2A. In the conventional clock gating cell 40 shown in FIG. 4A, synchronizer circuit 16 synchronizes the enable signal to the clock input (clk_in) before supplying a synchronized enable signal (enable_sync) to latch 14. Latch 14 holds the active high enable signal until the next falling edge of the clock input (clk_in) is received by the latch. Once the enable signal is latched (enable_lat), AND gate 12 generates a gated clock (clk_out) on the next rising edge of the clock input (clk_in), as shown in FIG. 4B (PRIOR ART).

Although the conventional clock gating cells shown in FIGS. 3A and 4A prevent clock glitches and metastable events, the synchronizers 16 included within these cells increase latency and consume (or swallow) two clock pulses before un-gating the clock. This is undesirable in many applications and circuits where data must be captured or transmitted on the first clock pulse. For example, the Serial Peripheral Interconnect (SPI) protocol requires slave devices to receive and transmit data on the first incoming clock pulse. Since the clock gating cells shown in FIGS. 3A and 4A consume two synchronization clock pulses, they cannot be used to un-gate clocks supplied to SPI circuitry.

SUMMARY

The present disclosure provides various embodiments of improved clock gating cells and related methods to provide a gated clock output. The following description of various embodiments of clock gating cells and related methods represent example embodiments and is not to be construed in any way as limiting the subject matter of the appended claims.

In general, a clock gating cell in accordance with the present disclosure may include a first mutually exclusive element, a first inverter and a second mutually exclusive element. The first mutually exclusive element may be coupled to receive a clock input and an enable signal, which is asynchronous to the clock input, and may be configured to output the enable signal based on a timing relationship between the clock input and the enable signal. The first inverter may be coupled to receive the enable signal output by the first mutually exclusive element, and may be configured to output an inverted enable signal. The second mutually exclusive element may be coupled to receive the clock input and the inverted enable signal, and may be configured to provide a clock output based on a timing relationship between the clock input and the inverted enable signal.

In the disclosed embodiments, the enable signal is active high and the clock input is either active high or active low. When the clock input is active high, the second mutually exclusive element provides an active high clock output for the clock gating cell. When the clock input is active low, clock inputs of the first and second mutually exclusive elements are inverted, and a second inverter is added to the clock gating cell and coupled to an output of the second mutually exclusive element. The second inverter is coupled to receive the clock output generated by the second mutually exclusive element, and is configured to invert the clock output, so as to provide an active low clock output for the clock gating cell.

According to one embodiment, an asynchronous, active high clock gating cell is provided herein and configured to provide a clock output. The asynchronous, active high clock gating cell may generally include a first mutually exclusive element, a first inverter and a second mutually exclusive element, as described above, and may be configured to receive an active high enable signal and an active high clock input. The asynchronous, active high clock gating cell may provide a clock output, as described in more detail below.

If the first mutually exclusive element receives a rising edge of the enable signal during a logic low phase of the clock input: the first mutually exclusive element may provide a logic high enable signal to the first inverter with substantially no delay, the first inverter may provide a logic low inverted enable signal to the second mutually exclusive element, and the second mutually exclusive element may generate the clock output once the clock input transitions from the logic low phase to a logic high phase.

If the first mutually exclusive element receives a falling edge of the enable signal during a logic low phase of the clock input: the first mutually exclusive element may provide a logic low enable signal to the first inverter with substantially no delay, the first inverter may provide a logic high inverted enable signal to the second mutually exclusive element, and the second mutually exclusive element may disable the clock output upon receiving the logic high inverted enable signal.

If the first mutually exclusive element receives a rising edge of the enable signal during a logic high phase of the clock input: the first mutually exclusive element may provide a logic high enable signal to the first inverter once the clock input transitions from the logic high phase to a logic low phase, the first inverter may provide a logic low inverted enable signal to the second mutually exclusive element, and the second mutually exclusive element may generate the clock output once the clock input transitions from the logic low phase to a subsequent logic high phase of the clock input.

If the first mutually exclusive element receives a falling edge of the enable signal during a logic high phase of the clock input: the first mutually exclusive element may provide a logic low enable signal to the first inverter with substantially no delay, the first inverter may provide a logic high inverted enable signal to the second mutually exclusive element, and the second mutually exclusive element may disable the clock output once the clock input transitions from the logic high phase to a logic low phase.

If the first mutually exclusive element receives a rising edge of the enable signal and a rising edge of the clock input at substantially the same time: the first mutually exclusive element may provide a logic high enable signal to the first inverter after a time delay corresponding to a resolution time of the first mutually exclusive element, the first inverter may provide a logic low inverted enable signal to the second mutually exclusive element, and the second mutually exclusive element may generate the clock output once the logic low inverted enable signal is received.

If the first mutually exclusive element receives a falling edge of the enable signal and a rising edge of the clock input at substantially the same time: the first mutually exclusive element may provide a logic low enable signal to the first inverter with substantially no delay, the first inverter may provide a logic high inverted enable signal to the second mutually exclusive element, and the second mutually exclusive element may disable the clock output once the clock input transitions from a logic high phase to a logic low phase.

According to another embodiment, an asynchronous, active low clock gating cell is provided herein and configured to provide a clock output. The asynchronous, active low clock gating cell may generally include a first mutually exclusive element, a first inverter, a second mutually exclusive element, and a second inverter, as described above, and may be configured to receive an active high enable signal and an active low clock input. The asynchronous, active low clock gating cell may provide a clock output, as described in more detail below.

If the first mutually exclusive element receives a rising edge of the enable signal during a logic high phase of the clock input: the first mutually exclusive element may provide a logic high enable signal to the first inverter with substantially no delay, the first inverter may provide a logic low inverted enable signal to the second mutually exclusive element, and the second mutually exclusive element may generate the clock output once the clock input transitions from the logic high phase to a logic low phase.

If the first mutually exclusive element receives a falling edge of the enable signal during a logic high phase of the clock input: the first mutually exclusive element may provide a logic low enable signal to the first inverter with substantially no delay, the first inverter may provide a logic high inverted enable signal to the second mutually exclusive element, and the second mutually exclusive element may disable the clock output upon receiving the logic high inverted enable signal.

If the first mutually exclusive element receives a rising edge of the enable signal during a logic low phase of the clock input: the first mutually exclusive element may provide a logic high enable signal to the first inverter once the clock input transitions from the logic low phase to a logic high phase, the first inverter may provide a logic low inverted enable signal to the second mutually exclusive element, and the second mutually exclusive element may generate the clock output once the clock input transitions from the logic high phase to a subsequent logic low phase of the clock input.

If the first mutually exclusive element receives a falling edge of the enable signal during a logic low phase of the clock input: the first mutually exclusive element may provide a logic low enable signal to the first inverter with substantially no delay, the first inverter may provide a logic high inverted enable signal to the second mutually exclusive element, and the second mutually exclusive element may disable the clock output once the clock input transitions from the logic low phase to a logic high phase.

If the first mutually exclusive element receives a rising edge of the enable signal and a falling edge of the clock input at substantially the same time: the first mutually exclusive element may provide a logic high enable signal to the first inverter after a time delay corresponding to a resolution time of the first mutually exclusive element, the first inverter may provide a logic low inverted enable signal to the second mutually exclusive element, and the second mutually exclusive element may generate the clock output once the logic low inverted enable signal is received.

If the first mutually exclusive element receives a falling edge of the enable signal and a falling edge of the clock input at substantially the same time: the first mutually exclusive element may provide a logic low enable signal to the first inverter with substantially no delay, the first inverter may provide a logic high inverted enable signal to the second mutually exclusive element, and the second mutually exclusive element may disable the clock output once the clock input transitions from a logic low phase to a logic high phase.

According to another embodiment, a method is provided herein to provide a gated clock output. In general, the method may include receiving a clock input and an enable signal, which is asynchronous to the clock input, as inputs to a clock gating cell; selectively providing the enable signal to a first inverter of the clock gating cell based on a timing relationship between the clock input and the enable signal; inverting the enable signal via the first inverter; and selectively providing a gated clock output based on a timing relationship between the clock input and the inverted enable signal.

In some embodiments, said selectively providing the enable signal may include providing a logic high enable signal to the first inverter: (a) with substantially no delay, if a rising edge of the enable signal is received during an inactive phase of the clock input, (b) once the clock input transitions from an active phase to a subsequent inactive phase, if a rising edge of the enable signal is received during the active phase of the clock input, and (c) after a resolution time delay, if a rising edge of the enable signal and an active edge of the clock input are received at substantially the same time.

In some embodiments, said selectively providing the enable signal may include providing a logic low enable signal to the first inverter with substantially no delay if: (a) a falling edge of the enable signal is received during an inactive phase of the clock input, (b) a falling edge of the enable signal is received during an active phase of the clock input, or (c) a falling edge of the enable signal and an active edge of the clock input are received at substantially the same time.

In some embodiments, said selectively providing the clock output may include providing the gated clock output: (a) once the clock input transitions from an inactive phase to an active phase, if a rising edge of the enable signal is received during the inactive phase of the clock input, (b) once the clock input transitions from an inactive phase to a subsequent active phase of the clock input, if a rising edge of the enable signal is received during an active phase of the clock input, and (c) once a logic low inverted enable signal is received from the first inverter, if a rising edge of the enable signal and an active edge of the clock input are received at substantially the same time.

In some embodiments, said selectively providing the clock output may include disabling the gated clock output: (a) upon receiving a logic high inverted enable signal from the first inverter, if a falling edge of the enable signal is received during an inactive phase of the clock input, (b) once the clock input transitions from an active phase to an inactive phase, if a falling edge of the enable signal is received during the active phase of the clock input, and (c) once the clock input transitions from the active phase to the inactive phase, if a falling edge of the enable signal and an active edge of the clock input are received at substantially the same time.

BRIEF DESCRIPTION OF THE DRAWINGS

Other objects and advantages of the invention will become apparent upon reading the following detailed description and upon reference to the accompanying drawings.

Figure 1A:
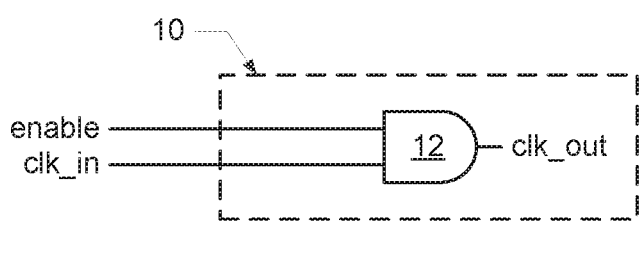
FIG. 1A (PRIOR ART) is a block diagram of a conventional AND gate clock gating cell.
Figure 1B:
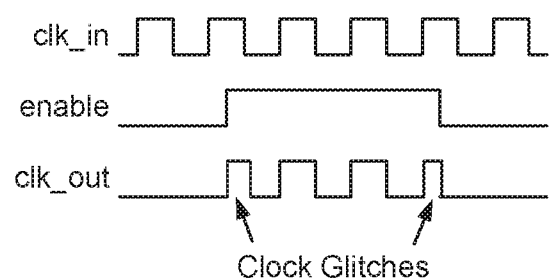
FIG. 1B (PRIOR ART) is a timing diagram for the clock gating cell shown in FIG. 1A.

While the present disclosure is susceptible to various modifications and alternative forms, specific embodiments thereof are shown by way of example in the drawings and will herein be described in detail. It should be understood, however, that the drawings and detailed description thereto are not intended to limit the present disclosure to the particular form disclosed, but on the contrary, the intention is to cover all modifications, equivalents and alternatives falling within the spirit and scope of the present disclosure as defined by the appended claims.

DETAILED DESCRIPTION OF THE PREFERRED EMBODIMENTS

Generally speaking, the present disclosure provides various embodiments of improved clock gating cells and related methods to provide a gated clock output. Unlike conventional clock gating cells, the clock gating cells and methods disclosed herein eliminate glitches in the clock output and resolve meta-stability, which occurs in some conventional clock gating circuits when an enable signal supplied to the clock gating cell changes state at the same time as the clock input.

As described in more detail below, the clock gating cells provided herein use two mutually exclusive elements to resolve meta-stability. A first mutually exclusive element (ME1) allows the enable signal to rise before the clock input transitions to an active phase, or delays the enable signal until the clock input transitions to an inactive phase. A second mutually exclusive element (ME2) allows the enable signal to fall before the clock input transitions to an active phase, or delays the enable signal until the clock input transitions to an inactive phase. Together, the first and second mutually exclusive elements (ME1 and ME2) resolve meta-stability and eliminate glitches in the clock output by preventing the rising and falling edges of the enable signal from passing through the mutually exclusive elements during the active phase of the clock input.

The clock gating cells provided herein generally include at least a first mutually exclusive element, a first inverter coupled to an output of the first mutually exclusive element and a second mutually exclusive element coupled to an output of the first inverter. The first mutually exclusive element is coupled to receive a clock input and an enable signal that is asynchronous to the clock input, and is configured to output the enable signal based on a timing relationship between the clock input and the enable signal. The first inverter is coupled to receive the enable signal output from the first mutually exclusive element, and is configured to provide an inverted enable signal to the second mutually exclusive element. The second mutually exclusive element is coupled to receive the clock input and the inverted enable signal, and is configured to provide a clock output based on a timing relationship between the clock input and the inverted enable signal.

In the disclosed embodiments, the enable signal is active high and the clock input is active high or active low. When the clock input is active high, the second mutually exclusive element provides an active high clock output for the clock gating cell. When the clock input is active low, clock inputs of the first and second mutually exclusive elements are inverted, and a second inverter is added to the clock gating cell and coupled to an output of the second mutually exclusive element. The second inverter is coupled to receive the clock output generated by the second mutually exclusive element, and is configured to invert the clock output, so as to provide an active low clock output for the clock gating cell.

Figure 5A:
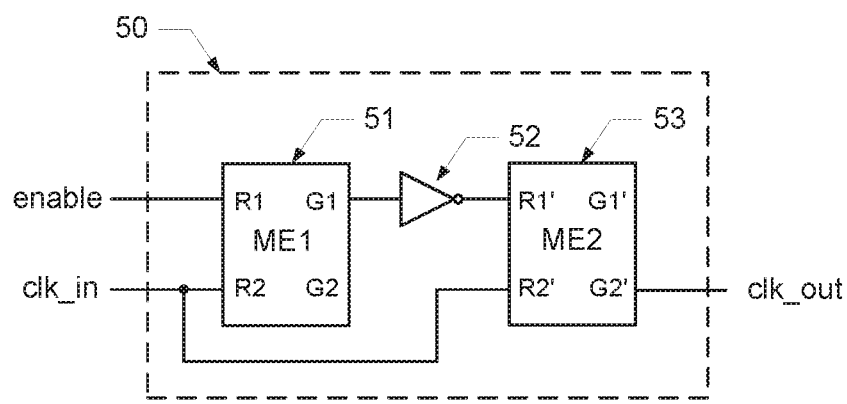
FIG. 5A is a block diagram illustrating one embodiment of an active high, asynchronous clock gating cell in accordance with the present disclosure.
Figure 6A:
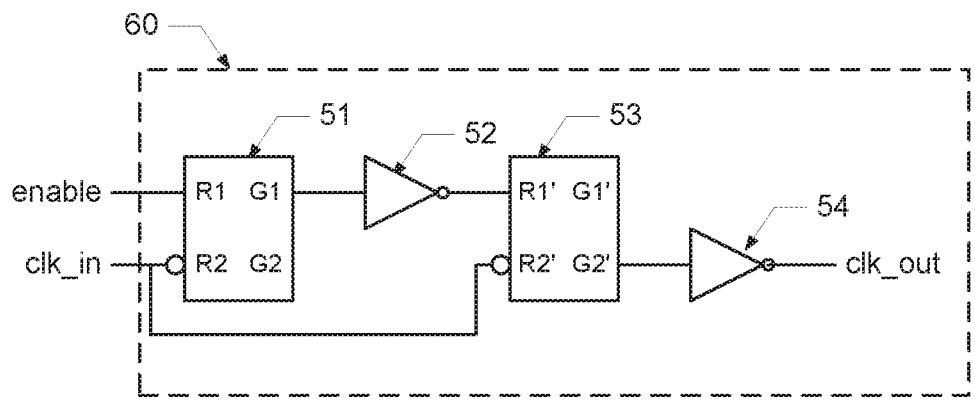
FIG. 6A is a block diagram illustrating one embodiment of an active low, asynchronous clock gating cell in accordance with the present disclosure.

FIGS. 5A and 6A illustrate two example embodiments of an improved clock gating cell in accordance with the present disclosure. The embodiment shown in FIG. 5A is configured to receive an active high clock input (clk_in), while the embodiment shown in FIG. 6A is configured to receive an active low clock input (clk_in). Each embodiment is configured to receive an enable signal, which is asynchronous to the clock input. Although the particular embodiments shown are configured to receive an active high enable signal, the clock gating cells disclosed herein could be modified to receive an active low enable signal by adding an inverter at the enable input of the first mutually exclusive element.

The active high, asynchronous clock gating cell 50 shown in FIG. 5A includes a first mutually exclusive element (ME1) 51, a first inverter 52 and a second mutually exclusive element (ME2) 53. The first mutually exclusive element 51 receives an active high enable signal (R1 input) and an active high clock input (R2 input), and outputs or selectively provides the enable signal (G1 output) to the first inverter 52 based on a timing relationship between the clock input and the rising and falling edges of the enable signal. The first inverter 52, coupled to the G1 output, inverts the enable signal and provides an inverted enable signal to the second mutually exclusive element 53. The second mutually exclusive element 53 receives the inverted enable signal (R1' input) and the clock input (R2' input), and outputs or selectively provides a clock output (G2' output) based on a timing relationship between the active high clock input and the rising edges and falling edges of the inverted enable signal.

The mutually exclusive elements 51 and 53 shown in FIG. 5A resolve meta-stability by allowing only one input signal (e.g., enable or clk_in for ME1; inverted enable or clk_in for ME2) to pass through the mutually exclusive element at a time. A mutually exclusive element is essentially a latch with an analog metastability filter on its outputs. If sufficient signal separation exists between input signal transitions, the mutually exclusive element passes the first signal received at its inputs to a corresponding output. However, if input signal transitions occur simultaneously, or within a device-specific time, the latch becomes metastable, but the metastability filters prevent the outputs of the mutually exclusive element from rising until the latch resolves the metastability condition. Although the time needed to resolve the metastability condition (i.e., the resolution time) is generally dependent on latch properties, it is typically very short (e.g., approximately 7-9 ns in a 40 nm technology node).

The mutually exclusive elements 51 and 53 shown in FIG. 5A may be implemented in a variety of different ways. Although one example of a mutually exclusive element is shown in FIG. 7, one skilled in the art would understand how other variations of mutually exclusive elements could also be used within the clock gating cells disclosed herein.

Figure 7:
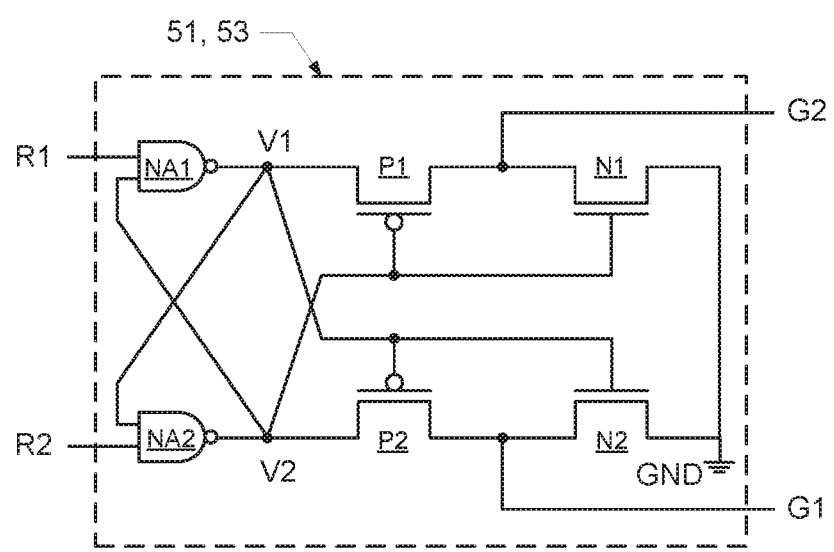
FIG. 7 is a circuit diagram illustrating one example embodiment of the mutually exclusive elements included within the clock gating cells disclosed herein.

The mutually exclusive element 51, 53 shown in FIG. 7 includes a pair of cross-coupled NAND gates (NA1 and NA2) forming a Set-Reset (SR) latch, and two pairs of Complementary-Metal-Oxide-Semiconductor (CMOS) transistors (P1/N1 and P2/N2) forming the metastability filters. Each output (V1, V2) of the SR latch is connected to the gate terminals of one pair of CMOS transistors (P1/N1 or P2/N2) and the source terminals of the PMOS transistor (P2 or P1) included within the other pair of CMOS transistors. For example, the gate terminals of CMOS transistors P1 and N1 are coupled to the output (V2) of the second NAND gate (NA2), while the gate terminals of CMOS transistors P2 and N2 are coupled to the output (V1) of the first NAND gate (NA1), included within the SR latch. The source terminal of the transistors N1 and N2 are coupled to ground (GND). The G1 output is coupled to the drain terminals of transistors P2 and N2. The G2 output is coupled to the drain terminals of transistors P1 and Ni.

The SR latch will stabilize into one of its stable states, if sufficient signal separation exists between rising transitions of the enable and clock input signals supplied to the R1 and R2 inputs of the mutually exclusive element. When the SR latch stabilizes, the voltage difference between V1 and V2 is greater than the negative threshold voltage of transistors P1 and P2, which causes either P1 or P2 to turn on (e.g., P1) and the corresponding output (e.g., G2) to rise. For example, if a rising edge of the enable signal arrives at R1 before a rising edge of the clock input arrives at R2, V2 becomes greater than V1, which turns on transistor P2, turns off transistor N2 and allows the enable signal to rise at the G1 output. If a rising edge of the clock input arrives at R2 before a rising edge of the enable signal arrives at R1, V1 becomes greater than V2, which turns on transistor P1, turns off transistor N1 and allows the clock input to rise at the G2 output.

When the mutually exclusive element receives concurrent signal transitions at R1 and R2, the SR latch enters into a metastable state, which causes the voltage difference between V1 and V2 to be less than the negative threshold voltage of transistors P1 and P2. This causes transistors P1 and P2 to turn off and prevents the G1 and G2 outputs of the mutually exclusive element from rising until the SR latch resolves the metastability condition and decides which input signal to pass through to its output. In other words, if a rising edge of the enable signal and a rising edge of the clock input arrives at the R1 and R2 inputs at substantially the same time, the mutually exclusive element prevents the G1 and G2 outputs from rising until the V1 and V2 nodes settle to their final voltage and the node with the greatest voltage drop wins after a time duration needed to resolve the metastability condition (i.e., a metastability resolution time). Once metastability is resolved, the G1 or G2 output corresponding to the winning node will be allowed to rise.

In this manner, the mutually exclusive element shown in FIG. 7 passes the first rising transition received at its inputs to a corresponding output, if sufficient signal separation exists between rising transitions of the input signals. If rising transitions arrive at substantially the same time, the metastability filters prevent the output of the mutually exclusive element from rising until the SR latch resolves the metastability condition and decides which input signal to pass through.

Figure 5B:
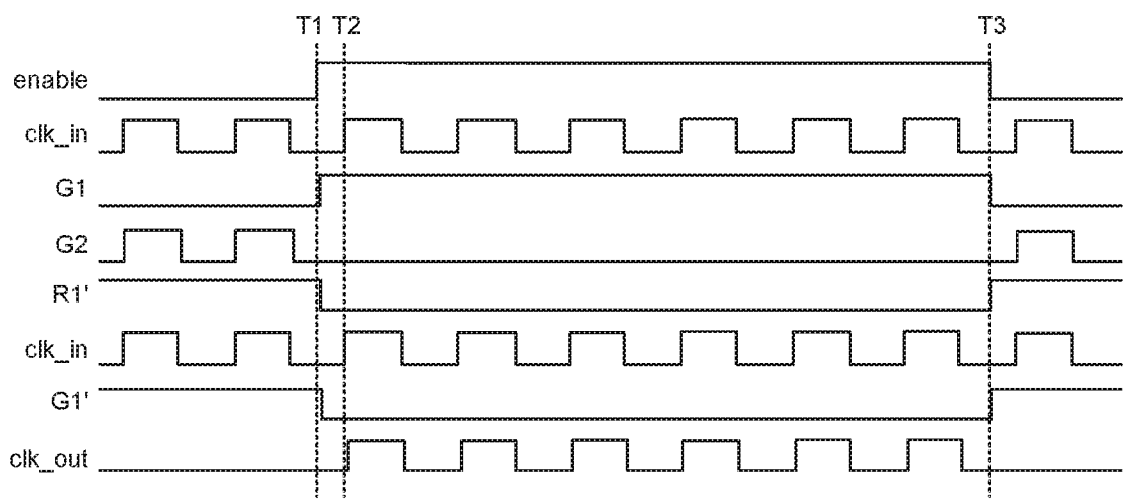
FIG. 5B is a timing diagram for the clock gating cell shown in FIG. 5A when rising and falling edges of the enable signal are received by the clock gating cell before a rising edge of the active high clock input.
Figure 5C:
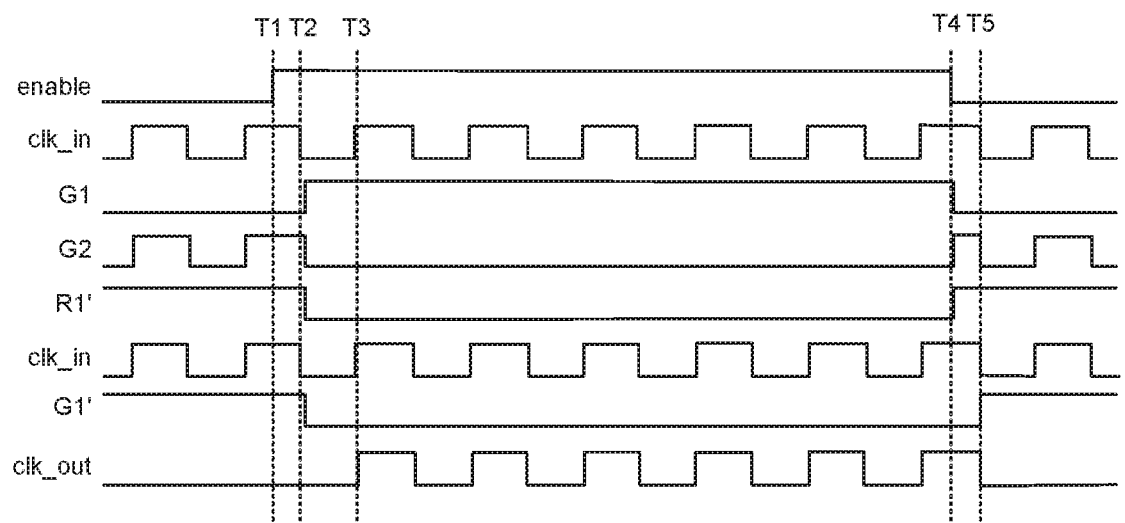
FIG. 5C is a timing diagram for the clock gating cell shown in FIG. 5A when the rising and falling edges of the enable signal are received by the clock gating cell after the rising edge of the active high clock input.
Figure 5D:
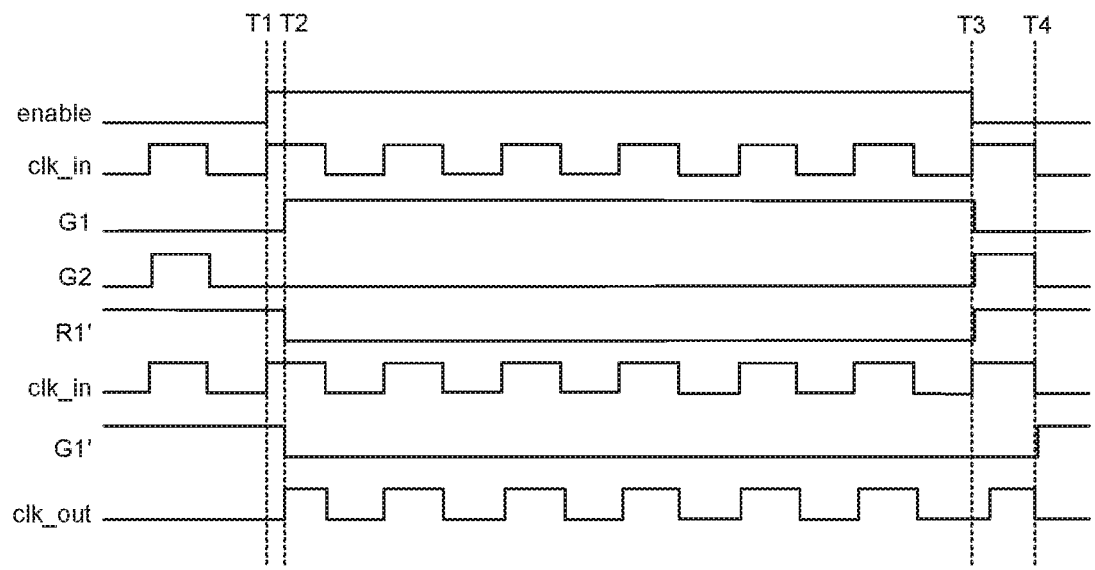
FIG. 5D is a timing diagram for the clock gating cell shown in FIG. 5A when rising and falling edges of the enable signal are received by the clock gating cell at substantially the same time as the rising edge of the active high clock input.

FIGS. 5B-D provide various timing diagrams to illustrate the operation of the active high, asynchronous clock gating cell 50 shown in FIG. 5A. Three corner cases are shown. FIG. 5B illustrates the case in which the rising and falling edges of the enable signal are received before a rising edge of the clock input is received (i.e., the rising and falling edges of the enable signal are received during an inactive phase, or logic low phase, of the active high clock input). FIG. 5C illustrates the case in which the rising and falling edges of the enable signal are received after the rising edge of the clock input is received (i.e., the rising and falling edges of the enable signal are received during an active phase, or logic high phase, of the active high clock input). FIG. 5D illustrates the case in which the rising and falling edges of the enable signal are received at substantially the same time as the rising edge of the clock input.

As shown in FIG. 5B, a rising edge of the enable signal is received at the R1 input of the first mutually exclusive element 51 (at time T1) during a logic low phase (i.e., an inactive phase) of the active high clock input (clk_in). When a rising edge of the enable signal is received before the rising edge of the clock input (clk_in) arrives, the first mutually exclusive element 51 exclusively propagates the enable signal from the R1 input to the G1 output (with minimum propagation delay), while preventing the clock input from passing through the first mutually exclusive element. When this occurs, the first mutually exclusive element 51 propagates a logic high enable signal (G1 output) to the first inverter 52 with substantially no delay. The first inverter 52 inverts the enable signal and provides a logic low inverted enable signal to the R1' input of the second mutually exclusive element 53. The second mutually exclusive element 53 generates a glitchless clock output (clk_out) once the clock input (clk_in) transitions from the logic low phase to a logic high phase (at time T2). As such, the clock gating cell 50 begins generating the glitchless clock output (i.e., un-gates the clock) as soon as the clock input transitions from an inactive phase to an active phase, if the rising edge of the enable signal is received during the inactive phase of the clock input. The clock output is subsequently gated, or disabled, by the falling edge of the enable signal.

As shown in FIG. 5B, a falling edge of the enable is received at the R1 input of the first mutually exclusive element 51 (at time T3) during a logic low phase (i.e., an inactive phase) of the logic high clock input (clk_in). When this occurs, the first mutually exclusive element 51 propagates a logic low enable signal (G1 output) to the first inverter 52 with substantially no delay, the first inverter 52 inverts the enable signal and provides a logic high inverted enable signal to the R1' input of the second mutually exclusive element 53. Since the clock input (clk_in) is in a logic low phase when the inverted enable signal supplied to the R1' input rises, the second mutually exclusive element 53 exclusively propagates the enable signal from the R1' input to the G1' output (with minimum propagation delay), while preventing the clock input from passing through the second mutually exclusive element to the clock output (clk_out). Thus, the second mutually exclusive element 53 disables the clock output (clk_out) upon receiving the logic high inverted enable signal. As such, the clock gating cell 50 disables the clock output (i.e., gates the clock) upon receiving the logic high inverted enable signal, if a falling edge of the enable signal is received during an inactive phase of the clock input.

As shown in FIG. 5C, a rising edge of the enable signal is received at the R1 input of the first mutually exclusive element 51 (at time Ti) during a logic high phase (i.e., an active phase) of the active high clock input (clk_in). Since the clock input (clk_in) is already in a logic high phase when the enable signal supplied to the R1 input rises, the first mutually exclusive element 51 exclusively propagates the clock input from the R2 input to the G2 output (with minimum propagation delay), while preventing the enable signal from passing through the first mutually exclusive element. Once the clock input transitions from the logic high phase to a logic low phase (at time T2), the first mutually exclusive element 51 propagates a logic high enable signal (G1 output) to the first inverter 52, the first inverter 52 inverts the enable signal and provides a logic low inverted enable signal to the R1' input of the second mutually exclusive element 53. The second mutually exclusive element 53 generates a glitchless clock output (clk_out) once the clock input (clk_in) transitions from the logic low phase to a subsequent logic high phase of the clock input (at time T3). As such, the clock gating cell 50 begins generating the glitchless clock output (i.e., un-gates the clock) once the clock input transitions from an inactive phase to a subsequent active phase of the clock input, if a rising edge of the enable signal is received during a previous active phase of the clock input. The clock output is subsequently gated, or disabled, by the falling edge of the enable signal.

As shown in FIG. 5C, a falling edge of the enable signal is received at the R1 input of the first mutually exclusive element 51 (at time T4) during a logic high phase (i.e., an active phase) of the active high clock input (clk_in). When this occurs, the first mutually exclusive element 51 propagates a logic low enable signal (G1 output) to the first inverter 52 with substantially no delay. The first inverter 52 inverts the enable signal and provides a logic high inverted enable signal to the R1' input of the second mutually exclusive element 53. Since the clock input (clk_in) is already in a logic high phase when the inverted enable signal supplied to the R1' input rises, the second mutually exclusive element 53 exclusively propagates the clock input from the R2' input to the G2' output, and prevents the enable input from passing through the second mutually exclusive element until the clock input transitions from the logic high phase to a logic low phase. Once the clock input (clk_in) transitions from the logic high phase to a logic low phase (at time T5), the second mutually exclusive element 53 disables the clock output (clk_out). As such, the clock gating cell 50 disables the clock output (i.e., gates the clock) once the clock input transitions from an active phase to an inactive phase, if a falling edge of the enable signal is received during the active phase of the clock input.

As shown in FIG. 5D, a rising edge of the enable signal and a rising edge of the clock input are received at the R1 and R2 inputs of the first mutually exclusive element 51 at substantially the same time (at time T1). When concurrent active transitions are received, metastability occurs within the first mutually exclusive element 51. In general, the first mutually exclusive element 51 resolves the metastability condition depending on the strength and timing of its inputs before providing a corresponding output. For example, if the enable signal supplied to the R1 input is stronger, or arrives slightly earlier than the clock input supplied to the R2 input, the first mutually exclusive element 51 will give priority to the enable input and propagate a logic high enable signal to the first inverter 52 (at time T2) after a short resolution time, while blocking the path of the clock input to the G2 output. This scenario is illustrated in FIG. 5D.

As shown in FIG. 5D, the resolution time (T2-T1) of the first mutually exclusive element 51 is relatively short (e.g., approximately 7-9 ns in 40 nm technology node). After the metastability condition is resolved, the first inverter 52 inverts the enable signal and provides a logic low inverted enable signal to the R1' input of the second mutually exclusive element 53. The second mutually exclusive element 53 generates a glitchless clock output (clk_out) once the logic low inverted enable signal is received. As such, the clock gating cell 50 begins generating the glitchless clock output (i.e., un-gates the clock) once a logic low inverted enable signal is received from the first inverter 52, if a rising edge of the enable signal and a rising edge of the clock input are received at substantially the same time. The clock output is subsequently gated, or disabled, by the falling edge of the enable signal.

Although not illustrated in FIG. 5D, the clock gating cell 50 shown in FIG. 5A will also produce a glitchless clock output if rising edges of the enable signal and the clock input are received at substantially the same time (at time T1), but the enable input supplied to the R1 input was weaker, or arrived slightly later than the clock input supplied to the R2 input. When this occurs, the first mutually exclusive element 51 will give priority to the clock input and allow the clock input to propagate from the R2 input to the G2 output (after a short resolution time), while blocking the path of the enable signal until the clock input falls. Once the clock input falls, the first mutually exclusive element 51 propagates the enable signal to the first inverter 52, which inverts the enable signal and provides a logic low inverted enable signal to the R1' input of the second mutually exclusive element 53. The second mutually exclusive element 53 generates a glitchless clock output (clk_out) once the logic low inverted enable signal is received. As such, the clock gating cell 50 begins generating the glitchless clock output (i.e., un-gates the clock) once the clock input transitions from an inactive phase to a subsequent active phase of the clock input, if a rising edge of the enable signal is received at substantially the same time as the clock input, and if the enable input supplied to the R1 input was weaker, or arrived slightly later than the clock input supplied to the R2 input.

As shown in FIG. 5D, a falling edge of the enable signal and a rising edge of the clock input are received at the R1 and R2 inputs of the first mutually exclusive element 51 at substantially the same time (at time T3). Although concurrent signal transitions are received at time T3, the first mutually exclusive element 51 provides a logic low enable signal to the first inverter 52 with substantially no delay, due to the falling edge of the enable signal. The first inverter 52 inverts the enable signal and provides a logic high inverted enable signal to the R1' input of the second mutually exclusive element 53. Since the rising edge of the inverted enable signal and the rising edge of the clock input are received by the second mutually exclusive element 53 at substantially the same time, metastability occurs within the second mutually exclusive element.

The second mutually exclusive element 53 resolves the metastability condition based on the strength and timing of its inputs before providing a corresponding output. FIG. 5D illustrates the case in which the clock input is stronger, or arrives slightly before the rising edge of the inverted enable signal. When this occurs, the second mutually exclusive element 53 continues to propagate the remaining logic high phase of the clock input without generating a glitch in the clock output, as long as the resolution time of the second mutually exclusive element is sufficiently shorter than the logic high phase of the clock input. Once the clock input (clk_in) transitions from the logic high phase to a logic low phase (at time T4), the second mutually exclusive element 53 disables the clock output (clk_out). As such, the clock gating cell 50 disables the clock output (i.e., gates the clock) once the clock input transitions from an active phase to an inactive phase, if a falling edge of the enable signal and an active edge of the clock input are received at substantially the same time.

Although not illustrated in FIG. 5D, the clock gating cell 50 shown in FIG. 5A will also disable the clock output if the rising edge of the inverted enable signal and the rising edge of the clock input are received at substantially the same time (at time T4), but the clock input was weaker, or arrived slightly after the rising edge of the inverted enable signal. When this occurs, the second mutually exclusive element 53 allows the inverted enable signal to propagate from the R1' input to the G1' output, while blocking the path of the clock input to the G2' output. Although this scenario is not illustrated in FIG. 5D, this scenario would also disable the clock output (i.e., gate the clock) without affecting the glitchless property of the clock gating cell.

FIG. 6A illustrates an alternative embodiment of a clock gating cell 60 in accordance with the present disclosure. Like the clock gating cell 50 shown in FIG. 5A, clock gating cell 60 includes a first mutually exclusive element (ME1) 51, a first inverter 52 and a second mutually exclusive element (ME2) 53. Since clock gating cell 60 is configured to receive an active low clock input (clk_in), the R2 input of the first mutually exclusive element 51 and the R2' input of the second mutually exclusive element 53 are inverted, and a second inverter 54 is added to the G2' output of the second mutually exclusive element 53.

In clock gating cell 60, the first mutually exclusive element 51 receives an active high enable signal (R1 input) and an active low clock input (R2 input), and outputs or selectively propagates the enable signal (G1 output) to the first inverter 52 based on a timing relationship between the clock input and the rising and falling edges of the enable signal. The first inverter 52, coupled to the G1 output, inverts the enable signal and provides an inverted enable signal to the second mutually exclusive element 53. The second mutually exclusive element 53 receives the inverted enable signal (R1' input) and the active low clock input (R2' input), and outputs or selectively propagates a clock output (G2' output) to the second inverter 54 based on a timing relationship between the active low clock input and the rising edges and falling edges of the inverted enable signal. The second inverter 54 inverts the clock output generated by the second mutually exclusive element 53 to provide an active low clock output for the clock gating cell 60.

Figure 6B:
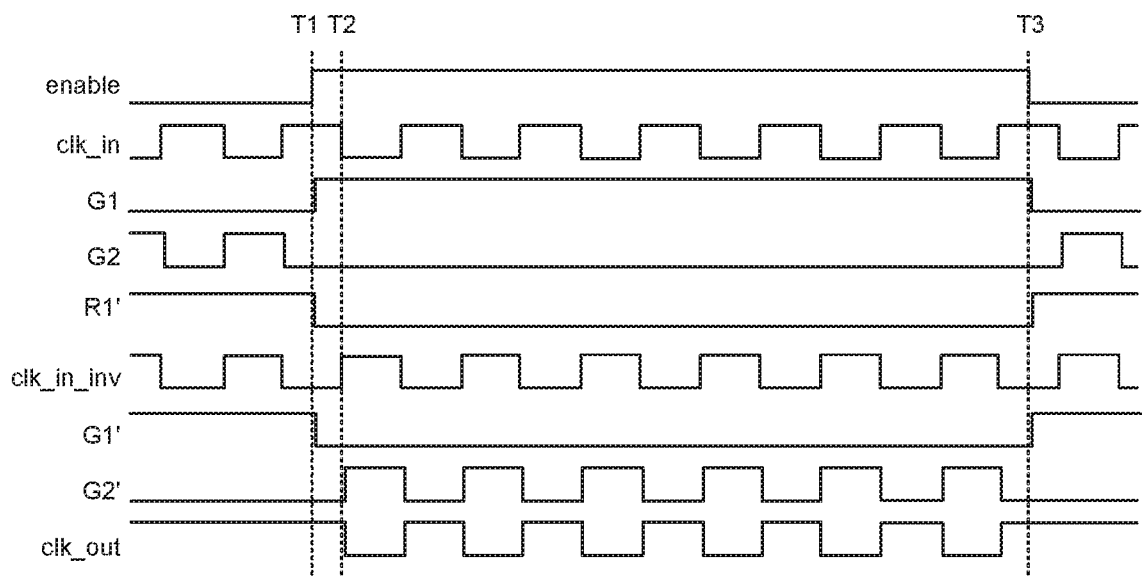
FIG. 6B is a timing diagram for the clock gating cell shown in FIG. 6A when rising and falling edges of the enable signal are received by the clock gating cell before a falling edge of the active low clock input.
Figure 6C:
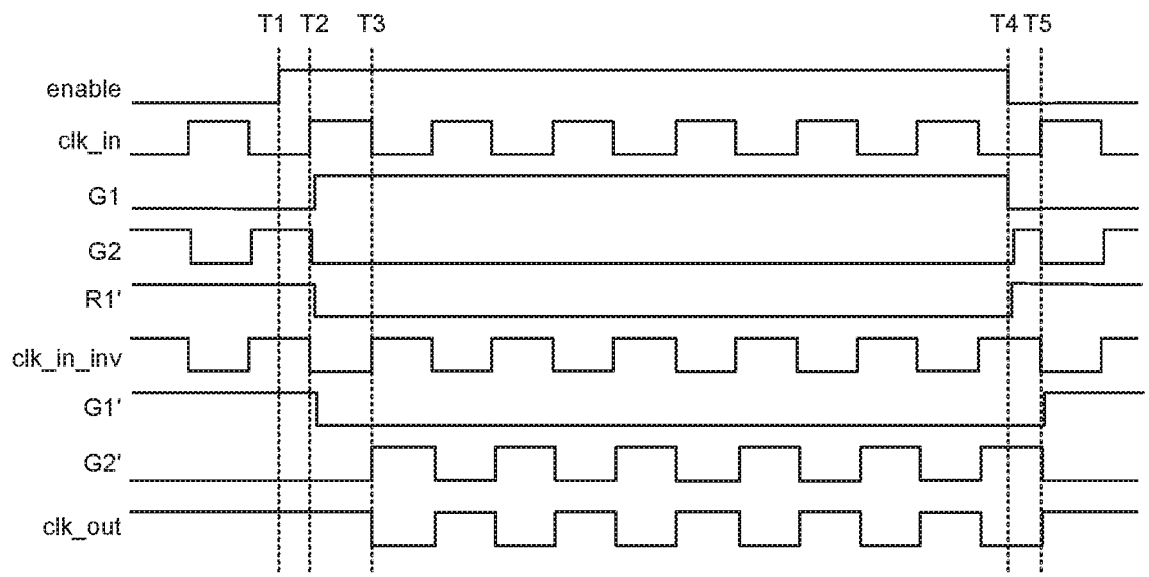
FIG. 6C is a timing diagram for the clock gating cell shown in FIG. 6A when the rising and falling edges of the enable signal are received by the clock gating cell after a falling edge of the active low clock input.
Figure 6D:
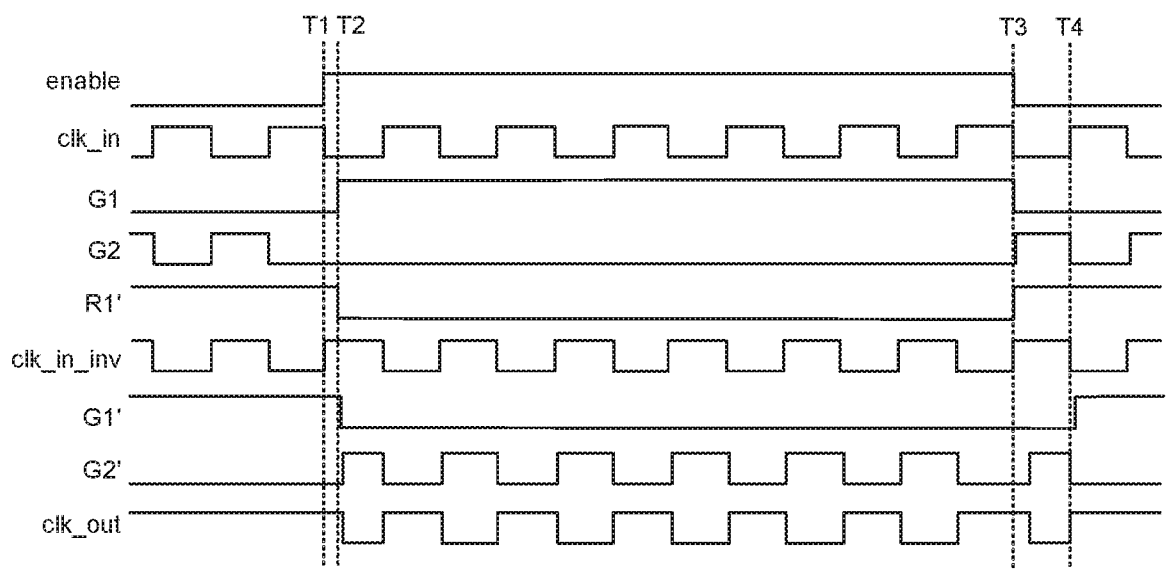
FIG. 6D is a timing diagram for the clock gating cell shown in FIG. 6A when the rising and falling edges of the enable signal are received by the clock gating cell at substantially the same time as the falling edge of the active low clock input.

FIGS. 6B-D provide various timing diagrams to illustrate the operation of the active low, asynchronous clock gating cell 60 shown in FIG. 6A. Again, three corner cases are shown. FIG. 6B illustrates the case in which a rising and falling edges of the enable signal are received before a falling edge of the clock input is received (i.e., the rising and falling edges of the enable signal are received during an inactive phase, or logic high phase, of the active low clock input). FIG. 6C illustrates the case in which the rising and falling edges of the enable signal are received after the falling edge of the clock input is received (i.e., the rising and falling edges of the enable signal are received during an active phase, or logic low phase, of the active low clock input). FIG. 6D illustrates the case in which the rising and falling edges of the enable signal are received at substantially the same time as the falling edge of the clock input.

As shown in FIG. 6B, a rising edge of the enable signal is received at the R1 input of the first mutually exclusive element 51 (at time T1) during a logic high phase (i.e., an inactive phase) of the active low clock input (clk_in). Since the R2 input of the first mutually exclusive element 51 is inverted in FIG. 6A, the rising edge of the enable signal is received at the R1 input before the rising edge of the inverted clock input (clk_in_inv) arrives at the R2 input, as shown in FIG. 6B. When this occurs, the first mutually exclusive element 51 exclusively propagates the enable signal from the R1 input to the G1 output (with minimum propagation delay), while preventing the inverted clock input from passing through the first mutually exclusive element, and thus, propagates a logic high enable signal (G1 output) to the first inverter 52 with substantially no delay. The first inverter 52 inverts the enable signal and provides a logic low inverted enable signal to the R1' input of the second mutually exclusive element 53. When the inverted enable signal supplied to the R1' input is logic low, the second mutually exclusive element 53 generates the clock output (clk_out) once the clock input (clk_in) transitions from the logic high phase to a logic low phase and the inverted clock input (clk_in_inv) transitions from the logic low phase to a logic high phase (at time T2). As such, the clock gating cell 60 begins generating the clock output (i.e., un-gates the clock) as soon as the clock input transitions from an inactive phase to an active phase, if the rising edge of the enable signal is received during the inactive phase of the clock input. The clock output is subsequently gated, or disabled, by the falling edge of the enable signal.

As shown in FIG. 6B, a falling edge of the enable signal is received at the R1 input of the first mutually exclusive element 51 (at time T3) during a logic high phase (i.e., an inactive phase) of the active low clock input (clk_in). When this occurs, the first mutually exclusive element 51 propagates a logic low enable signal (G1 output) to the first inverter 52 with substantially no delay. The first inverter 52 inverts the enable signal and provides a logic high inverted enable signal to the R1' input of the second mutually exclusive element 53. Since the inverted clock input (clk_in_inv) supplied to the R2' input is in a logic low phase when the inverted enable signal supplied to the R1' input rises, the second mutually exclusive element 53 exclusively propagates the inverted enable signal from the R1' input to the G1' output (with minimum propagation delay), while preventing the inverted clock input from passing through the second mutually exclusive element to the clock output (clk_out). In other words, the second mutually exclusive element 53 disables the clock output (clk_out) upon receiving a logic high inverted enable signal during a logic high phase of the clock input (clk_in) or a logic low phase of the inverted clock input (clk_in_inv). As such, the clock gating cell 60 disables the clock output (i.e., gates the clock) upon receiving the logic high inverted enable signal, if a falling edge of the enable signal is received during an inactive phase of the clock input.

As shown in FIG. 6C, a rising edge of the enable signal is received at the R1 input of the first mutually exclusive element 51 (at time T1) during a logic low phase (i.e., an active phase) of the active low clock input (clk_in). Since the clock input (clk_in) is already in a logic low phase (and the inverted clock input, clk_in_inv, is already in a logic high phase) when the enable signal supplied to the R1 input rises, the first mutually exclusive element 51 exclusively propagates the inverted clock input from the R2 input to the G2 output (with minimum propagation delay), while preventing the enable signal from passing through the first mutually exclusive element. Once the clock input (clk_in) transitions from the logic low phase to a logic high phase and the inverted clock input, clk_in_inv, transitions from the logic high phase to a logic low phase (at time T2), the first mutually exclusive element 51 provides a logic high enable signal (G1 output) to the first inverter 52, the first inverter 52 inverts the enable signal and provides a logic low inverted enable signal to the R1' input of the second mutually exclusive element 53. The second mutually exclusive element 53 generates the clock output (clk_out) once the clock input (clk_in) transitions from the logic high phase to a subsequent logic low phase of the clock input (at time T3). As such, the clock gating cell 60 begins generating the clock output (i.e., un-gates the clock) once the clock input transitions from an inactive phase to a subsequent active phase of the clock input, if a rising edge of the enable signal is received during a previous active phase of the clock input. The clock output is subsequently gated, or disabled, by the falling edge of the enable signal.

As shown in FIG. 6C, a falling edge of the enable signal is received at the R1 input of the first mutually exclusive element 51 (at time T4) during a logic low phase (i.e., an active phase) of the active low clock input (clk_in). When this occurs, the first mutually exclusive element propagates a logic low enable signal (G1 output) to the first inverter 52 with substantially no delay. The first inverter 52 inverts the enable signal and provides a logic high inverted enable signal to the R1' input of the second mutually exclusive element 53. Since the clock input (clk_in) is already in a logic low phase (and the inverted clock input, clk_in_inv, is already in a logic high phase) when the inverted enable signal supplied to the R1' input rises (at time T4), the second mutually exclusive element 53 exclusively propagates the inverted clock input from the R2' input to the G2' output, while preventing the enable input from passing through the second mutually exclusive element until the clock input (clk_in) transitions from the logic low phase to a logic high phase and the inverted clock input transitions from the logic high phase to a logic low phase. Once the inverted clock input (clk_in_inv) transitions from the logic high phase to a logic low phase (at time T5), the second mutually exclusive element 53 disables the clock output (clk_out). As such, the clock gating cell 60 disables the clock output (i.e., gates the clock) once the clock input transitions from an active phase to an inactive phase, if a falling edge of the enable signal is received during the active phase of the clock input.

As shown in FIG. 6D, a rising edge of the enable signal and a falling edge of the clock input are received at the R1 and R2 inputs of the first mutually exclusive element 51 at substantially the same time (at time T1). When concurrent active transitions are received, the first mutually exclusive element 51 resolves the metastability condition depending on the strength and timing of its inputs before providing a corresponding output. For example, if the enable signal supplied to the R1 input is stronger or arrives slightly earlier than the inverted clock input supplied to the R2 input, the first mutually exclusive element 51 will give priority to the enable input and provide a logic high enable signal to the first inverter 52 (at time T2) after a short resolution time, while blocking the path of the inverted clock input to the G2 output. This scenario is illustrated in FIG. 6D.

As shown in FIG. 6D, the resolution time (T2-T1) of the first mutually exclusive element 51 is relatively short (e.g., approximately 7-9 ns in 40 nm technology node). After the metastability condition is resolved, the first inverter 52 inverts the enable signal and provides a logic low inverted enable signal to the R1' input of the second mutually exclusive element 53. The second mutually exclusive element 53 generates the clock output (clk_out) once the logic low inverted enable signal is received. As such, the clock gating cell 60 begins generating the clock output (i.e., un-gates the clock) once a logic low inverted enable signal is received from the first inverter 52, if a rising edge of the enable signal and a falling edge of the clock input are received at substantially the same time. The clock output is subsequently gated, or disabled, by the falling edge of the enable signal.

Although not illustrated in FIG. 6D, the clock gating cell 60 shown in FIG. 6A will also produce a glitchless clock output if rising edges of the enable signal and the inverted clock input are received at substantially the same time (at time T1), but the enable input supplied to the R1 input is weaker, or arrives slightly later than the inverted clock input supplied to the R2 input. When this occurs, the first mutually exclusive element 51 will give priority to the inverted clock input and allow the inverted input clock to propagate from the R2 input to the G2 output (after a short resolution time), while blocking the path of the enable signal until the inverted clock input falls. Once the inverted clock input falls, the first mutually exclusive element 51 propagates the enable signal to the first inverter 52, which inverts the enable signal and provides a logic low inverted enable signal to the R1' input of the second mutually exclusive element 53. The second mutually exclusive element 53 generates a glitchless clock output (clk_out) once the logic low inverted enable signal is received. As such, the clock gating cell 60 begins generating the glitchless clock output (i.e., un-gates the clock) once the clock input transitions from an inactive phase to a subsequent active phase of the clock input, if a rising edge of the enable signal is received at substantially the same time as the clock input, and if the enable input supplied to the R1 input was weaker, or arrived slightly later than the clock input supplied to the R2 input.

As shown in FIG. 6D, a falling edge of the enable signal and a falling edge of the clock input are received at the R1 and R2 inputs of the first mutually exclusive element 51 at substantially the same time (at time T3). Although concurrent signal transitions are received at time T3, the first mutually exclusive element 51 provides a logic low enable signal (G1 output) to the first inverter 52 with substantially no delay, due to the falling edge of the enable signal. The first inverter 52 inverts the enable signal and provides a logic high inverted enable signal to the R1' input of the second mutually exclusive element 53. Since the rising edge of the inverted enable signal and the rising edge of the inverted clock input (clk_in_inv) are received by the second mutually exclusive element 53 at substantially the same time, metastability occurs within the second mutually exclusive element.

As explained previously, the second mutually exclusive element 53 resolves the metastability condition based on the strength and timing of its inputs before providing a corresponding output. FIG. 6D illustrates the case in which the inverted clock input is stronger, or arrives slightly before the rising edge of the inverted enable signal. When this occurs, the second mutually exclusive element 53 continues to propagate the remaining logic high phase of the inverted clock input supplied to the R2' input without generating a glitch in the clock output, as long as the resolution time of the second mutually exclusive element is sufficiently shorter than the logic high phase of the inverted clock input. The second mutually exclusive element 53 disables the clock output (clk_out) once the clock input (clk_in) transitions from a logic low phase to a logic high phase and the inverted clock input (clk_in_inv) transitions from a logic high phase to a logic low phase (at time T4). As such, the clock gating cell 60 disables the clock output (i.e., gates the clock) once the clock input transitions from an active phase to an inactive phase, if a falling edge of the enable signal and an active edge of the clock input are received at substantially the same time.

Although not illustrated in FIG. 6D, the clock gating cell 60 shown in FIG. 6A will also disable the clock output if the rising edge of the inverted enable signal and the rising edge of the inverted clock input are received at substantially the same time (at time T4), but the inverted clock input was instead weaker, or arrived slightly after the rising edge of the inverted enable signal. When this occurs, the second mutually exclusive element 53 allows the inverted enable signal to propagate to the G1' output, while blocking the path of the inverted clock input to the G2' output. Although this scenario is not illustrated in FIG. 6D, this scenario disables the clock output (i.e., gates the clock) without affecting the glitchless property of the clock gating cell.

As shown in FIGS. 5B, 5C, 6B and 6C, the clock gating cells shown in FIGS. 5A and 6A eliminate glitches in the clock output (clk_out) by preventing the rising and falling edges of the enable signal from passing through the mutually exclusive elements 51 and 53 during the active phase of the clock input (clk_in). Specifically, the first mutually exclusive element 51 handles the rising edge of the enable signal by allowing the enable signal to rise before the clock input transitions to the active phase (FIGS. 5B and 6B), or delays the enable signal until the clock input transitions to the inactive phase (FIGS. 5C and 6C). The second mutually exclusive element 53 handles the falling edge of the enable signal by allowing the enable signal to fall before the clock input transitions to the active phase (FIGS. 5B and 6B), or delays the enable signal until the clock input transitions to the inactive phase (FIGS. 5C and 6C).

Figure 2A:
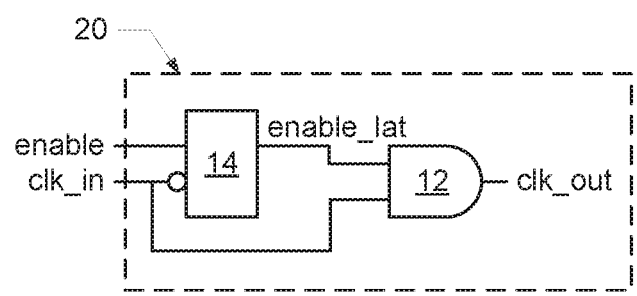
FIG. 2A (PRIOR ART) is a block diagram of a conventional latch-based AND gate clock gating cell.
Figure 2B:
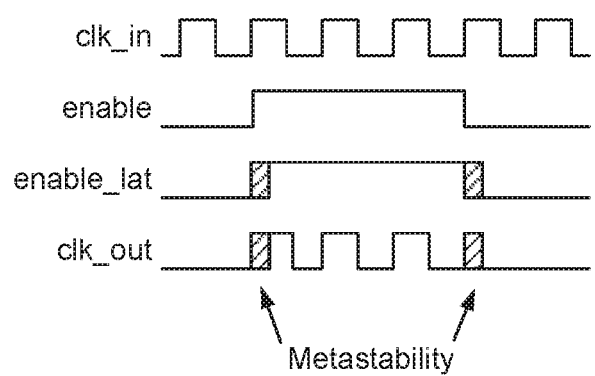
FIG. 2B (PRIOR ART) is a timing diagram for the clock gating cell shown in FIG. 2A.
Figure 3A:
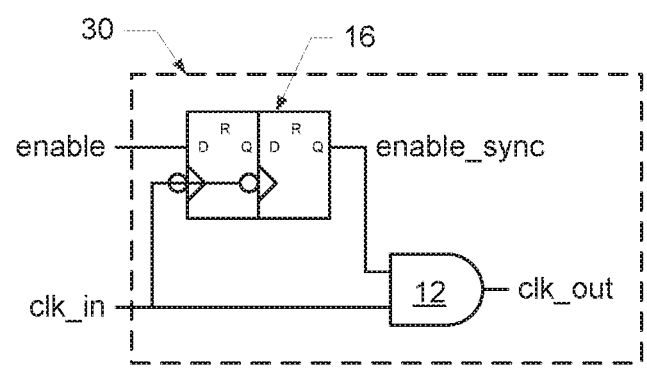
FIG. 3A (PRIOR ART) is a block diagram of a conventional AND gate clock gating cell, which includes a synchronizer for synchronizing an enable signal to the input clock.
Figure 3B:
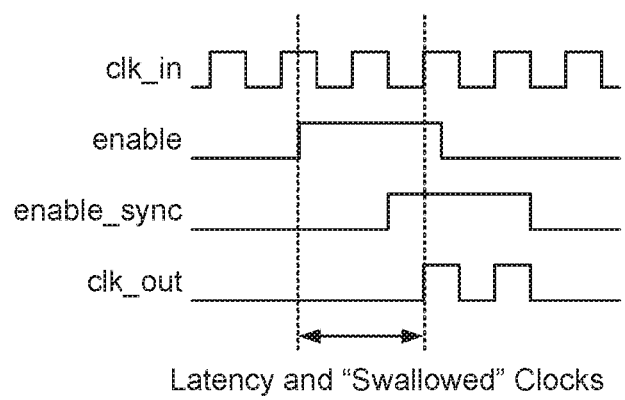
FIG. 3B (PRIOR ART) is a timing diagram for the clock gating cell shown in FIG. 3A.
Figure 4A:
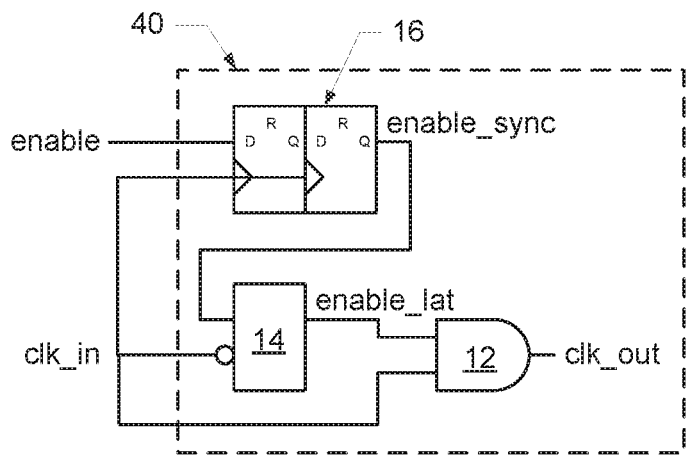
FIG. 4A (PRIOR ART) is a block diagram of a conventional latch-based AND gate clock gating cell, which includes a synchronizer for synchronizing an enable signal to the input clock.
Figure 4B:
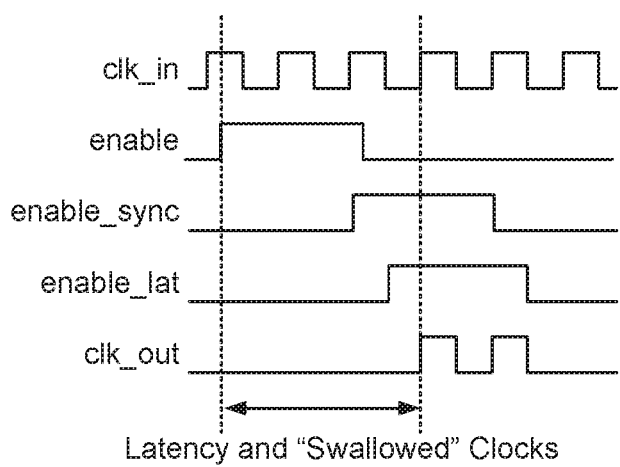
FIG. 4B (PRIOR ART) is a timing diagram for the clock gating cell shown in FIG. 4A.

As shown in FIGS. 5D and 6D, the clock gating cells shown in FIGS. 5A and 6A also avoid the metastability that may otherwise occur when transitions of the enable signal and the active edge of the clock input are received by the clock gating cell at substantially the same time. Compared to conventional latch-based clock gating cells (see, e.g., FIGS. 2A and 2B), for example, metastability is avoided in clock gating cells 50 and 60 by utilizing a pair of mutually exclusive elements 51 and 53. As shown in FIGS. 5D and 6D, the pulse width of the first and last pulses of the clock output (clk_out) are shortened, due to the propagation delay through the circuit elements and the resolution time of the mutually exclusive elements 51 and 53. If the active phase width of the clock input is reasonably greater (e.g., at least 15-20 ns greater) than the propagation delay and the resolution time, these shortened pulses are guaranteed not to be clock glitches. As shown in FIGS. 5D and 6D, the shortened pulses are greater than one-half of the clock output pulse width, and thus, are not clock glitches.

It will be appreciated to those skilled in the art having the benefit of this disclosure that this disclosure is believed to provide various embodiments of improved clock gating cells and related methods to provide a gated clock output. It is to be understood that the various embodiments of the disclosed clock gating cells and related methods shown and described herein are to be taken as the presently preferred embodiments. Elements and materials may be substituted for those illustrated and described herein, parts and processes may be reversed, and certain features of the disclosed embodiments may be utilized independently, all as would be apparent to one skilled in the art after having the benefit of this disclosure.

Although the clock gating cells 50, 60 shown in FIGS. 5A and 6A are currently considered to be preferred embodiments, a clock gating cell in accordance with the present disclosure is not strictly limited to the example embodiments shown in FIGS. 5A and 6A and described above. In some embodiments, additional logic circuitry may be added to the outputs of the second mutually exclusive element 53 to control the gating and un-gating of the clock output and ease the clock tree synthesis backend implementation by allowing better control of clock skew balancing.

Figure 8:
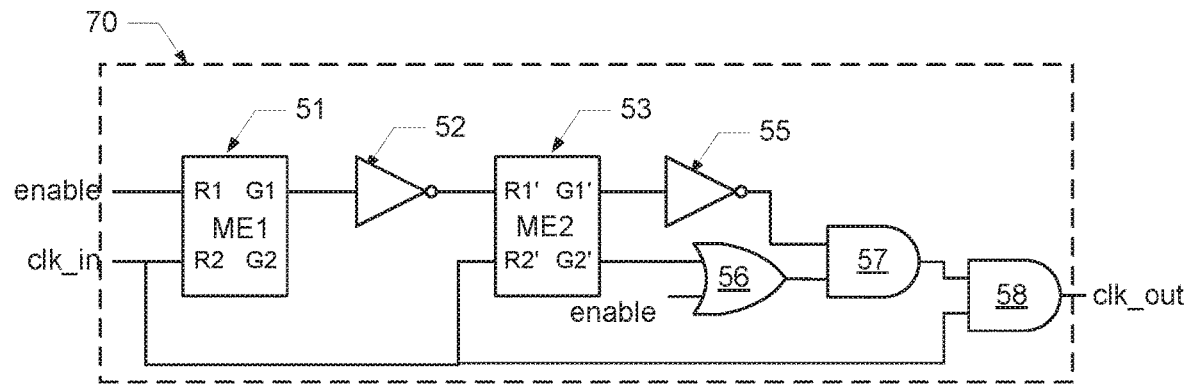
FIG. 8 is a block diagram illustrating another embodiment of an active high, asynchronous clock gating cell in accordance with the present disclosure.
Figure 9:
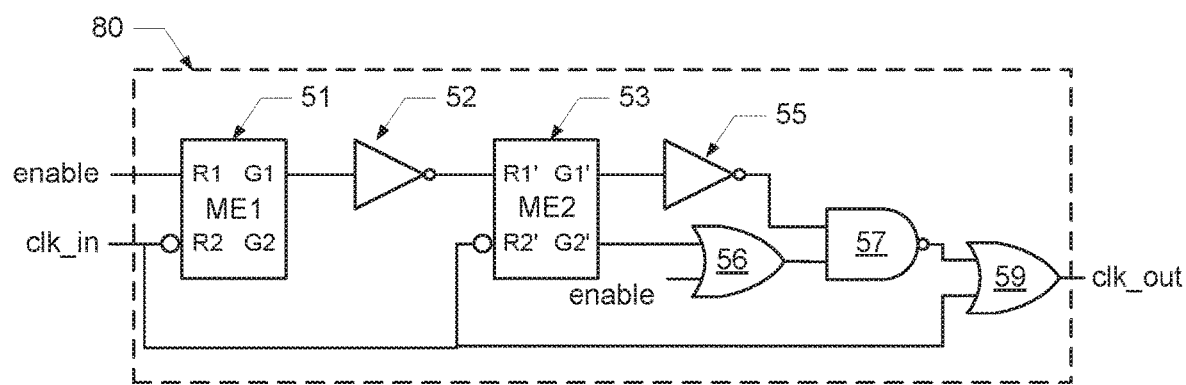
FIG. 9 is a block diagram illustrating another embodiment of an active low, asynchronous clock gating cell in accordance with the present disclosure.

FIG. 8 illustrates another embodiment of an active high, asynchronous clock gating cell 70, while FIG. 9 illustrates another embodiment of an active low, asynchronous clock gating cell 80. Although similar to the embodiments shown in FIGS. 5A and 6A, the clock gating cells 70 and 80 use additional logic circuitry (e.g., AND gate 58, OR gate 59) to gate the clock output (clk_out), instead of the second mutually exclusive element 53.

The active high, asynchronous clock gating cell 70 shown in FIG. 8 includes a third inverter 55, an OR gate 56, a first AND gate 57 and a second AND gate 58. The third inverter 55 is coupled to the G1' output of the second mutually exclusive element 53. One input of the OR gate 56 is coupled to the G2' output of the second mutually exclusive element 53, while the other input is coupled to receive the enable signal. Inputs of the first AND gate 57 are coupled to the output of the third inverter 55 and the output of the OR gate 56. One input of the second AND gate 58 is coupled to the output of the first AND gate 57, while the other input is coupled to receive the active high clock input.

The clock gating cell 70 shown in FIG. 8 is similar to the clock gating cell 50 shown in FIG. 5A and is used for an active high clock input. The advantage of this variation over the embodiment shown in FIG. 5A is that the clock is gated by AND gate 58, not the second mutually exclusive element 53. This eases clock tree synthesis backend implementation by allowing better control of clock skew balancing. The top input of AND gate 58 is a "clean version" of the enable signal in the sense that the enable signal either arrives before the active phase of the clock input, or is delayed until the clock input transitions to an inactive phase, to avoid clock glitches in the clock output. The bottom input of AND gate 58 holds off the metastability resolution of the second mutually exclusive element 53 when enable signal changes from high to low. Together, they form the complete clock enable signal for AND gate 58.

The active low, asynchronous clock gating cell 80 shown in FIG. 9 includes a third inverter 55, an OR gate 56, a first NAND gate 57 and an OR gate 59. The third inverter 55 is coupled to the G1' output of the second mutually exclusive element 53. One input of the OR gate 56 is coupled to the G2' output of the second mutually exclusive element 53, while the other input is coupled to receive the enable signal. Inputs of the NAND gate 57 are coupled to the output of the third inverter 55 and the output of the OR gate 56. One input of the OR gate 59 is coupled to the output of the NAND gate 57, while the other input is coupled to receive the active low clock input.

The clock gating cell 80 shown in FIG. 9 is similar to the clock gating cell 60 shown in FIG. 6A and is used for an active low clock input. The advantage of this variation over the embodiment shown in FIG. 5A is that the clock is gated by OR gate 59, not the second mutually exclusive element 53. This eases clock tree synthesis backend implementation by allowing better control of clock skew balancing. The top input of NAND 57 is the "clean version" of the enable signal in the sense that the enable signal either arrives before the active phase of the clock input, or is delayed until the clock input transitions to an inactive phase, to avoid clock glitches in the clock output. The bottom input of NAND 57 holds off the metastability resolution of the second mutually exclusive element 53 when the enable signal changes from high to low. Together, they form the complete clock enable signal for OR gate 59.

Further modifications and alternative embodiments of various aspects of the disclosure will be apparent to those skilled in the art in view of this description. It is intended, therefore, that the following claims be interpreted to embrace all such modifications and changes and, accordingly, the specification and drawings are to be regarded in an illustrative rather than a restrictive sense.

What is claimed is:

1. A clock gating cell, comprising:
    a first mutually exclusive element coupled to receive a clock input and an enable signal, which is asynchronous to the clock input, wherein the first mutually exclusive element is configured to output the enable signal based on a timing relationship between the clock input and the enable signal;
    a first inverter coupled to receive the enable signal output by the first mutually exclusive element, wherein the first inverter is configured to output an inverted enable signal; and
    a second mutually exclusive element coupled to receive the clock input and the inverted enable signal, wherein the second mutually exclusive element is configured to provide a clock output based on a timing relationship between the clock input and the inverted enable signal.

2. The clock gating cell as recited in claim 1, wherein the clock input and the enable signal are both active high, and wherein the clock output generated by the second mutually exclusive element provides an active high clock output for the clock gating cell.

3. The clock gating cell as recited in claim 2, wherein if the first mutually exclusive element receives a rising edge of the enable signal during a logic low phase of the clock input:
    the first mutually exclusive element provides a logic high enable signal to the first inverter with substantially no delay;
    the first inverter provides a logic low inverted enable signal to the second mutually exclusive element; and
    the second mutually exclusive element generates the clock output once the clock input transitions from the logic low phase to a logic high phase.

4. The clock gating cell as recited in claim 2, wherein if the first mutually exclusive element receives a falling edge of the enable signal during a logic low phase of the clock input:
    the first mutually exclusive element provides a logic low enable signal to the first inverter with substantially no delay;
    the first inverter provides a logic high inverted enable signal to the second mutually exclusive element; and
    the second mutually exclusive element disables the clock output upon receiving the logic high inverted enable signal.

5. The clock gating cell as recited in claim 2, wherein if the first mutually exclusive element receives a rising edge of the enable signal during a logic high phase of the clock input:
    the first mutually exclusive element provides a logic high enable signal to the first inverter once the clock input transitions from the logic high phase to a logic low phase;
    the first inverter provides a logic low inverted enable signal to the second mutually exclusive element; and
    the second mutually exclusive element generates the clock output once the clock input transitions from the logic low phase to a subsequent logic high phase of the clock input.

6. The clock gating cell as recited in claim 2, wherein if the first mutually exclusive element receives a falling edge of the enable signal during a logic high phase of the clock input:
    the first mutually exclusive element provides a logic low enable signal to the first inverter with substantially no delay;
    the first inverter provides a logic high inverted enable signal to the second mutually exclusive element; and
    the second mutually exclusive element disables the clock output once the clock input transitions from the logic high phase to a logic low phase.

7. The clock gating cell as recited in claim 2, wherein if the first mutually exclusive element receives a rising edge of the enable signal and a rising edge of the clock input at substantially the same time:
    the first mutually exclusive element provides a logic high enable signal to the first inverter after a time delay corresponding to a resolution time of the first mutually exclusive element;
    the first inverter provides a logic low inverted enable signal to the second mutually exclusive element; and
    the second mutually exclusive element generates the clock output once the logic low inverted enable signal is received.

8. The clock gating cell as recited in claim 2, wherein if the first mutually exclusive element receives a falling edge of the enable signal and a rising edge of the clock input at substantially the same time:
    the first mutually exclusive element provides a logic low enable signal to the first inverter with substantially no delay;
    the first inverter provides a logic high inverted enable signal to the second mutually exclusive element; and
    the second mutually exclusive element disables the clock output once the clock input transitions from a logic high phase to a logic low phase.

9. The clock gating cell as recited in claim 1, wherein the clock input is active low, wherein the enable signal is active high, and wherein the clock gating cell further comprises a second inverter, which is coupled to invert the clock output generated by the second mutually exclusive element to provide an active low clock output for the clock gating cell.

10. The clock gating cell as recited in claim 9, wherein if the first mutually exclusive element receives a rising edge of the enable signal during a logic high phase of the clock input:
    the first mutually exclusive element provides a logic high enable signal to the first inverter with substantially no delay;
    the first inverter provides a logic low inverted enable signal to the second mutually exclusive element; and
    the second mutually exclusive element generates the clock output once the clock input transitions from the logic high phase to a logic low phase.

11. The clock gating cell as recited in claim 9, wherein if the first mutually exclusive element receives a falling edge of the enable signal during a logic high phase of the clock input:
  the first mutually exclusive element provides a logic low enable signal to the first inverter with substantially no delay;
  the first inverter provides a logic high inverted enable signal to the second mutually exclusive element; and
  the second mutually exclusive element disables the clock output upon receiving the logic high inverted enable signal.

12. The clock gating cell as recited in claim 9, wherein if the first mutually exclusive element receives a rising edge of the enable signal during a logic low phase of the clock input:
  the first mutually exclusive element provides a logic high enable signal to the first inverter once the clock input transitions from the logic low phase to a logic high phase;
  the first inverter provides a logic low inverted enable signal to the second mutually exclusive element; and
  the second mutually exclusive element generates the clock output once the clock input transitions from the logic high phase to a subsequent logic low phase of the clock input.

13. The clock gating cell as recited in claim 9, wherein if the first mutually exclusive element receives a falling edge of the enable signal during a logic low phase of the clock input:
  the first mutually exclusive element provides a logic low enable signal to the first inverter with substantially no delay;
  the first inverter provides a logic high inverted enable signal to the second mutually exclusive element; and
  the second mutually exclusive element disables the clock output once the clock input transitions from the logic low phase to a logic high phase.

14. The clock gating cell as recited in claim 9, wherein if the first mutually exclusive element receives a rising edge of the enable signal and a falling edge of the clock input at substantially the same time:
  the first mutually exclusive element provides a logic high enable signal to the first inverter after a time delay corresponding to a resolution time of the first mutually exclusive element;
  the first inverter provides a logic low inverted enable signal to the second mutually exclusive element; and
  the second mutually exclusive element generates the clock output once the logic low inverted enable signal is received.

15. The clock gating cell as recited in claim 9, wherein if the first mutually exclusive element receives a falling edge of the enable signal and a falling edge of the clock input at substantially the same time:
  the first mutually exclusive element provides a logic low enable signal to the first inverter with substantially no delay;
  the first inverter provides a logic high inverted enable signal to the second mutually exclusive element; and
  the second mutually exclusive element disables the clock output once the clock input transitions from a logic low phase to a logic high phase.

16. A method, comprising:
  receiving a clock input and an enable signal, which is asynchronous to the clock input, as inputs to a clock gating cell;
  selectively providing the enable signal to a first inverter of the clock gating cell based on a timing relationship between the clock input and the enable signal;
  inverting the enable signal via the first inverter; and
  selectively providing a gated clock output based on a timing relationship between the clock input and the inverted enable signal.

17. The method as recited in claim 16, wherein said selectively providing the enable signal comprises providing a logic high enable signal to the first inverter:
  with substantially no delay, if a rising edge of the enable signal is received during an inactive phase of the clock input;
  once the clock input transitions from an active phase to a subsequent inactive phase, if a rising edge of the enable signal is received during the active phase of the clock input; and
  after a resolution time delay, if a rising edge of the enable signal and an active edge of the clock input are received at substantially the same time.

18. The method as recited in claim 16, wherein said selectively providing the enable signal comprises providing a logic low enable signal to the first inverter with substantially no delay if:
  a falling edge of the enable signal is received during an inactive phase of the clock input;
  a falling edge of the enable signal is received during an active phase of the clock input; or
  a falling edge of the enable signal and an active edge of the clock input are received at substantially the same time.

19. The method as recited in claim 16, wherein said selectively providing the clock output comprises providing the gated clock output:
  once the clock input transitions from an inactive phase to an active phase, if a rising edge of the enable signal is received during the inactive phase of the clock input;
  once the clock input transitions from an inactive phase to a subsequent active phase of the clock input, if a rising edge of the enable signal is received during an active phase of the clock input; and
  once a logic low inverted enable signal is received from the first inverter, if a rising edge of the enable signal and an active edge of the clock input are received at substantially the same time.

20. The method as recited in claim 16, wherein said selectively providing the clock output comprises disabling the gated clock output:
  upon receiving a logic high inverted enable signal from the first inverter, if a falling edge of the enable signal is received during an inactive phase of the clock input;
  once the clock input transitions from an active phase to an inactive phase, if a falling edge of the enable signal is received during the active phase of the clock input; and
  once the clock input transitions from the active phase to the inactive phase, if a falling edge of the enable signal and an active edge of the clock input are received at substantially the same time.

* * * * *